United States Patent [19]

McFarland

[11] Patent Number: 4,775,609

[45] Date of Patent: Oct. 4, 1988

[54] IMAGE REVERSAL

[75] Inventor: Michael J. McFarland, Bound Brook, N.J.

[73] Assignee: Hoechst Celanese Corporation, Somerville, N.J.

[21] Appl. No.: 50,808

[22] Filed: May 18, 1987

[51] Int. Cl.$^4$ .................................................. G03C 5/16
[52] U.S. Cl. ..................... 430/325; 430/328; 430/330; 430/394; 430/270
[58] Field of Search ............... 430/328, 330, 394, 325, 430/270

[56] References Cited

U.S. PATENT DOCUMENTS

| | | | |
|---|---|---|---|
| 4,104,070 | 8/1978 | Moritz et al. | 430/191 |
| 4,491,628 | 1/1985 | Ito et al. | 430/176 |
| 4,546,066 | 10/1985 | Field et al. | 430/330 X |

OTHER PUBLICATIONS

L. F. Thompson et al., ACS Symposium Series 219, 117 (1983).
Semiconductor International, Apr. 1987, pp. 88–89.
M. Spak et al., Proceedings of the SPE Regional Technical Conference on "Photopolymers: Priciples, Processes, and Materials," Ellenville, N.Y. (1985), p. 247–269.
R. M. R. Gijsen et al., SPIE vol. 631, Advances in Resist Technology and Processing III, (1986), pp. 108–116.

Primary Examiner—Paul R. Michl
Assistant Examiner—Cynthia Hamilton

[57] ABSTRACT

A positive acting photoresist system including a hydrophobic blocked polymer can be made to function in a negative sense (or tone) in what is known as an "image reversal" process, which may be summarized as follows:

(1) After being exposed to UV radiation through a mask pattern to produce photogenerated acid, a photoresist coated wafer is treated with a gaseous base such as ammonia. The base reacts with photogenerated acid to produce a salt, effectively preventing deblocking of the polymer.

(2) The wafer then is exposed to a vacuum to remove any excess base.

(3) The wafer is then flood-exposed (i.e., no mask is used) with UV light. This produces acid in the previously masked-over areas. The sensitizer has already been largely destroyed in the original image area and so little acid is produced there.

(4) The wafer is then baked to deblock the polymer in the area not exposed in step (1) and developed in aqueous alkali. The resulting image is the inverse of the original mask pattern. That is, those areas that received irradiation through the mask remain, and those areas that were flood-exposed are removed by the developer.

26 Claims, No Drawings

IMAGE REVERSAL

FIELD OF THE INVENTION

This invention relates to a method for reversing the image of certain positive acting photoresists. This method allows for the production of both negative tone relief images and positive tone relief images from the same resist composition.

CROSS-REFERENCE TO RELATED APPLICATION

The subject matter of this application relates to an improvement over the co-pending Application Ser. No. 832,116 filed on Feb. 24, 1986.

BACKGROUND OF THE INVENTION

Many manufacturers, but particularly those who manufacture high density integrated circuits are interested in constructing very small patterns in a thin film known as a resist. These films are typically 1 to 2 $\mu$m thick on the substrate to be patterned, and the size of the desired pattern may be as small as 1 $\mu$m or less. One method of forming these patterns involves the use of photolithography, where the optical image of a mask, having the desired pattern on it, is focused onto the photoresist coated surface of the substrate. When exposed to a developing solution, the photoresist used will either remain behind where it was exposed to light or it will be removed where it was exposed to light. In the former case this is referred to as a negative acting resist, while in the latter case it is known as a positive acting resist.

It has been observed that existing negative acting photoresist films have a distinct tendency to swell during the resist's development because organic solvents are employed as developers. As a result, it is difficult to form patterns having a narrow open gap between two pads of resist because the resist remaining behind swells such that the narrow gap is bridged over, i.e., the resist from the two, supposedly separate, pads will touch each other during development. Even though the resist film will shrink after being removed from the developer, in the locations where swollen resist contacted another part of the pattern a stringy or filmy bridge will be created between the two parts of the pattern.

Because of these swelling problems and because positive acting resists are known not to swell upon development, it has become accepted practice to utilize positive acting resists for high resolution microphotolithography. However, for some patterns it would be more convenient to be able to use a negative tone resist. For example, a mask of a certain pattern may be more easily prepared, or might be more reliable to use if it were mostly dark with a few clear areas rather than if it were the opposite tone, namely, mostly clear with a few dark areas. That this might be the case can readily be imagined by considering the effect of dust particles on a mostly clear mask as opposed to a mostly dark mask. Any dust particle in the mask's clear area will be reproduced in the resist as a defect regardless of the tone of the resist. Therefore, the mostly clear mask has, proportionately, a greater area susceptible to particle contamination than does the mostly dark mask.

It is known that conventional positive acting photoresists comprised of novolac binder resin and diazoketone or diazoquinone photosensitizer can be caused to yield negative tone images as disclosed, for example, in the U.S. Pat. No. 4,104,070 and in L. F. Thompson, C. G. Willson and M. J. Bowden, ACS Symposium Series 219, 117 (1983).

These images are of high quality since there is no swelling of the resist during the development. The transformation (from positive to negative acting) results from the following chemical processes:

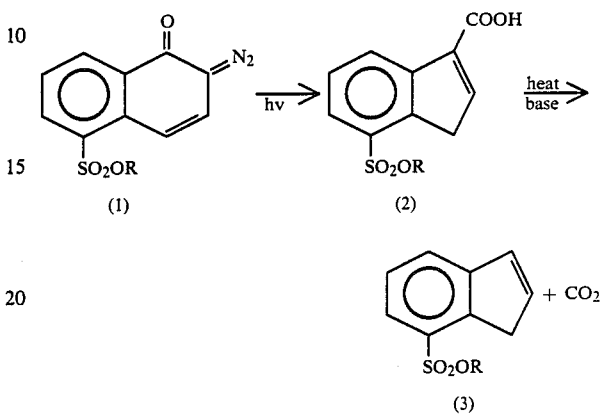

Initially the resist film is insoluble in aqueous developer due to the hydrophobic character of sensitizer (1) (the novolac resin itself is hydrophilic and already soluble in the developer). Upon being converted to photoproduct (2), the sensitizer is transformed into an indene carboxylic acid which is hydrophilic and is itself soluble in the developer solution. Since the novolac resin is already soluble, this causes the resist film to become soluble in the developer where it was exposed to light. However, in the image reversal process, the substrate is heated, in the presence of a catalyst such as Monazoline or ammonia vapor, so that the carboxylic acid (2) is decarboxylated to give an indene compound (3) which is hydrophobic and which makes the film insoluble again. This process was described in *Semiconductor International*, April 1987, at pages 88-89. However, it is suggested that the use of amines neutralizes carboxylic acids to make the sensitizer (photoacid) less soluble. Actually, the amine salt would be quite soluble in the developer and, therefore, the decarboxylation process referred to above must proceed to the final indene product to render the irradiated areas insoluble. After making the exposed portion of the film insoluble, the entire resist film is flood exposed to light without any image. During this exposure step, the areas previously unexposed during the imagewise exposure are rendered soluble as the sensitizer (1) is converted into carboxylic acid (2). The areas which previously had been exposed to light remain hydrophobic and insoluble since in these regions the sensitizer has already been consumed. All examples of this type of image reversal utilize a base soluble novolac resin whose dissolution is controlled by the diazoquinone sensitizer. If the sensitizer is in a hydrophobic state, the film is insoluble, whereas if it is in a hydrophilic state, the film is soluble. Therefore, in order for the image reversal process to work, the decarboxylation reaction [(2)→(3)] must proceed for the sensitizer (and thus the film) to revert to an insoluble state.

It also has been demonstrated that no final flood exposure is needed if the sensitizer is chosen such that its acid photoproduct is capable of cross-linking the exposed areas during a high temperature post-exposure bake. This type of image reversal does not utilize an amine treatment. (Mechanism and Lithographic Evaluation of Image Reversal in AZ ®5214 Photoresist, M. Spak, et al., Proceedings of the SPE Regional Technical Conference on "Photopolymers: Principles, Processes and Materials", Ellenville, N.Y. (1985), p. 247-269.)

Thus, image reversal processes used with hydrophilic novolac resins and diazoquinone sensitizers produce an insoluble hydrophobic region by decarboxylation of indene carboxylic acids or by acid-catalyzed cross-linking. (See R. M. R. Gijsen, et al., "A Quantitative Assessment of Image Reversal, A Candidate for a Submicron Process with Improved Linewidth Control," SPIE Vol. 631, Advances in Resist Technology and Processing III, (1986), p. 108-116).

Conventional novolac photoresists are limited in that they cannot be exposed at short ultraviolet wavelengths, ≦300 nm, to give high resolution images because of the intense absorbancy of novolac resin in this region. Positive acting resists have been developed to circumvent this problem (e.g., U.S. Pat. No. 4,491,628 and U.S. Application Ser. No. 832,116) by using different sensitizers and different binder resins. The sensitizers are compounds such as onium salts which produce a strong acid upon photolysis, while the resins are polymers selected for their UV-transparency and other physical properties. The resins have as an integral part an acid labile group, the removal of which is capable of transforming the polymer from insoluble in aqueous developer to soluble in aqueous developer. It has been claimed (U.S. Pat. No. 4,491,628) that such resists may be processed to give a negative tone image by using an organic, non-polar solvent as the developer rather than the aqueous alkali used to prepare positive tone images. This has the disadvantage of requiring the use of materials more difficult to handle, due to their flammability, toxicity or volatility as compared to those of the positive tone processing conditions. These organic developers also reintroduce the possibility of swelling and crazing of the polymer films.

SUMMARY OF THE INVENTION

The invention comprises a novel method for utilizing certain positive acting photoresists, which normally rely on a photochemically produced acid to chemically deblock certain hydrophobic groups on a polymer rendering it soluble in an aqueous alkaline developer. In the new method, these photoresists provide a negative instead of a positive tone. The resist film is exposed through a pattern mask, treated by contacting it with a gaseous base such as ammonia or an amine to prevent deblocking the polymer, removing the excess base, flood-exposing the entire film, baking to deblock the polymer, and developing the film in an aqueous alkali solution to produce the negative tone image of the mask.

When a positive photoresist of the type disclosed above is exposed through a pattern mask, photoacid is produced in the irradiated areas. By treating the resist with a base, the acid in the exposed areas is neutralized to a salt via an acid-base reaction and the deblocking effect usually obtained in the baking step does not occur. The polymer remains unblocked and hydrophobic. The resist is then blanket exposed to produce photoacid in the previously unexposed areas and then processed to develop the image. The resulting image is negative rather than positive. The technique uses a positive resist to obtain a negative tone and in so doing permits the relative advantages inherent in positive resists, such as better resolution, aqueous development, less developer toxicity, less film swelling and the like.

Preferably the polymer used in the photoresist is an imide containing polymer where the imide functionalities have been blocked with an acid-labile group, particularly a tert-butyloxycarbonyl group. Other polymers which may have application in the method of the invention include those having functionalities, e.g., phenol or carboxylic acid functions which are blocked with acid-labile groups.

Various latent photoacids may be used provided they do not yield carboxylic acids. Onium salts are preferred, especially triflates ($CF_3SO_3^-$).

DETAILED DESCRIPTION OF THE INVENTION

It has now been discovered that resists which employ hydrophobic blocked polymers can be treated according to the method of the present invention to give a negative tone image after developing in the standard aqueous alkali developer. The unexpected result occurs in spite of the inability of the photoacids produced in the newer resist systems, such as hydrofluoric acid or trifluoromethane sulfonic acid, to undergo the decarboxylation reaction which is requisite to the operation of U.S. Pat. No. 4,104,070, due to the fact that they are not carboxylic acids. In addition, the acid is treated with a base at room temperature whereas the decarboxylation process requires that the resist be heated in the presence of the base. The invention thus represents an improvement of the art in that it allows image reversal techniques to be applied to these newer resists of U.S. Pat. No. 4,491,628 and Application Ser. No. 832,116. The method consists of the following steps:

1. Coating the substrate with a photoresist film comprising a hydrophobic blocked polymer and a latent photoacid.
2. Exposing the resist film through a mask to generate a photoacid in the exposed area but without deblocking the polymer.
3. Without carrying out a baking step to deblock the polymer, treating the resist film by contacting it with the gaseous base, such as ammonia or triethylamine to neutralize the acid generated in step 2 to a salt via an acid-base reaction.
4. Removing excess base, e.g., by evacuation or placing the substrate in a stream of inert gas.
5. Flood exposing the entire resist film to photogenerate acid in areas not exposed in step 2.
6. Baking the substrate and resist film to deblock the polymer in the region not exposed in step 2.
7. Development of the film in aqueous alkali solution to give the negative tone image of the mask by removing the resist layer except for the portion exposed in step 2.

It has been discovered that the following chemical steps are important in this invention. In step (2) of the above sequence of steps, sensitizer is converted to strong acid in those areas which receive exposure through open areas of the mask. The acid should not deblock the hydrophobic polymer at normal temperatures, otherwise it will become soluble in aqueous developer and the neutralization step (3) will not be effective. In step (3), the gaseous base enters the film and undergoes an acid/base reaction with the photogenerated acid. In this manner, the acid becomes a salt. This salt will no longer have the ability to catalyze the crucial removal of the acid labile group of the polymer, i.e., deblock it.

Note that such a step would be insufficient with photoresists using novolac resins and diazoquinone sensitizers because the salt is hydrophilic and the film would dissolve. The present photoresists require that a hydrophobic species be formed to prevent the resin from dissolving. Conversely, the preferred photoacids for the present invention produce strong acids such as HF, $CF_3SO_3H$, p-toluene sulfonic acid and $H_2SO_4$ which can react with amines to give salts, but do not form any insoluble species.

The important characteristics of the base are a reasonably high vapor pressure at room temperature and the ability to penetrate the film and react with the photoacid. This dictates that the base be a small molecule such as ammonia or an organic amine with less than 12 carbon atoms. In step (4), the wafer is placed in a vacuum or a stream of inert gas for a short time to remove any excess gaseous base. The ease of removal dictates which of the amines of step (3) is preferred. Thus, tertiary amines such as triethylamine are preferred to primary amines such as methylamine. In step (5), the entire wafer is flood exposed, which transforms the remaining sensitizer to photoacid. This sensitizer is that which was not exposed (under the dark areas of the mask) in the original imagewise exposure. Thus, the concentration of acid in the film is reversed from that obtained with the mask pattern in a normal one-step exposure. In the baking step (6), the acid catalyzes the removal of the acid labile groups from the polymer as described in U.S. Pat. No. 4,491,628 and Application Ser. No. 832,116. This removal renders the polymer soluble in aqueous developer in those areas. In the areas which were irradiated by the original (masked) exposure, the photoacid has been rendered ineffective by the neutralization step (3), so the removal of the acid labile groups does not proceed and the polymer remains insoluble. In step (7), the wafer is placed in aqueous alkali solution which washes away the areas of the film that have undergone the acid catalyzed removal of the labile groups. The end result is a relief pattern of resist film on the substrate which duplicates the mask, but in a reverse tone. That is, the areas that remain and the areas that are washed away are opposite from that which would be obtained if steps (3), (4) and (5) were omitted.

Any of a variety of suitable gaseous bases in addition to ammonia and triethylamine may be employed in practicing the method of the invention. Preferred compounds include, for example, any of various primary, secondary or tertiary amines, more particularly those having 1 to 12 carbon atoms and which generate vapor capable of penetrating the photoresist film.

Any of various known resins which depend on a photoacid to chemically convert them to a soluble species from an insoluble species may be used as the polymeric constituent of the photoresist. Preferred are the polymers disclosed in co-pending application U.S. Ser. No. 832,116 which is incorporated herein by reference. Examples of such polymers are N-tert-butyloxycarbonyl maleimide/styrene copolymer, N-tert-butyloxycarbonyl maleimide homopolymer, N-tert-butyloxycarbonyl maleimide/vinyl ether copolymers where the vinyl ether is aliphatic from 3 (methyl vinyl ether) to 20 (octadecylvinyl ether) carbon atoms, N-tert-butyloxycarbonyl maleimide/2,4-disubstituted styrene copolymers where the styrene is substituted at the 2 and 4 positions with, independently, $C_1$ to $C_5$ alkyl groups or H. Other polymers which may be used include those in which a phenol containing polymer has the hydroxyl functionalities blocked with an acid-labile group such as poly(tert-butyloxycarbonyloxy-α-alkyl styrene) or a copolymer thereof, poly(tert-butyloxycarbonyloxy styrene) or a copolymer thereof, or polymers containing other acidic imide functionalities (—CO—NH—CO—) blocked by an acid labile group such as poly(dimethyl-N-tert-butyloxycarbonyl glutarimide), or polymers containing carboxylic acid functionalities blocked by an acid labile group such as poly(tert-butyl p-vinylbenzoate) or a copolymer thereof, poly(tert-butyl methacrylate) or a copolymer thereof, and the like. Other blocking groups may be present on the polymers to yield materials useful for the method of the invention. Examples of such groups may be found in U.S. patent application Ser. No. 832,116 and U.S. Pat. No. 4,491,628, e.g., benzyloxycarbonyl.

Although various latent photoacids can be used, diazoquinones which produce carboxylic acids do not efficiently deblock the hydrophobic polymer and are not preferred. Onium salts are preferred such as diazonium, iodonium, or sulfonium salts, particularly those having anions such as triflate ($CF_3SO_3^-$), methane sulfonate, or more generally $RSO_3^-$ where R is alkyl, aryl, or substituted alkyl or aryl. Particularly preferred are diphenyliodonium trifluoromethane sulfonate and triphenylsulfonium trifluoromethane sulfonate.

EXAMPLE 1

A positive photoresist was compounded by dissolving 9 parts (by weight) of N-tert-butoxycarbonyl maleimide/styrene copolymer and 1 part of diphenyliodonium trifluoromethanesulfonate in 27 parts of 2-methoxyethyl ether (diglyme). The resulting solution was filtered to 0.2 μm through a PTFE filter. The filtered solution was spin-cast onto clean 2" silicon wafers which had been exposed to vapor phase 1,1,1,3,3,3-hexamethyldisilazane to promote resist adhesion. After spinning, the wafers were softbaked at 80° C. for 20 minutes to remove residual diglyme. Each wafer was exposed to 100 mJ/cm² at 260±15 nm through a chrome on quartz pattern mask in vacuum contact with the resist layer. After exposure, the wafers were exposed to ammonia vapor for 1 minute at room temperature. Next the wafers were placed in a vacuum chamber and pumped down to 100 torr (13.332 kPa) for a period of 20 minutes. After removal from the chamber, the wafers were flood exposed at 260 nm with 200 mJ/cm². The exposed wafers were then baked for 2 minutes at 130° C. to allow the acid-catalyzed deblocking to occur. After baking, the wafers were developed in 1:1 tetramethylammonium hydroxide/tetrabutylammonium hydroxide (0.1N base strength) for a period of 20 seconds. The resulting pattern was the negative tone image of the mask used in the initial exposure.

EXAMPLE 2

Resist-coated wafers were prepared exactly as in Example 1. The wafers were exposed through a mask as in Example 1 but subsequently were exposed to vapors of triethylamine for a period of 10 minutes. The rest of the processing was the same as that detailed in Example 1 and again the resulting image was the negative tone of the image mask.

EXAMPLE 3

A positive photoresist was compounded by dissolving 15 parts by weight of poly(tert-butyloxycarbonyloxy styrene) and 1 part of diphenyl iodonium trifluoromethane sulfonate in 37.3 parts of 2-methoxyethylether (diglyme). The resulting solution was filtered to 0.2 μm through a PTFE filter. The filtered solution was spin-cast onto clean 2″ silicon wafers which had been exposed to 1,1,1,3,3,3-hexamethyldisilazane to promote resist adhesion to the substrate. After spinning, the wafers were baked at 55° C. for 15 minutes to remove the solvent. Each wafer was exposed to 100 mJ/cm$^2$ at 260±15 nm through a chrome on quartz pattern mask in vacuum contact with the resist layer. After exposure, the wafers were exposed to ammonia vapor for one minute at room temperature. The wafers were then placed in a stream of dry nitrogen to remove excess ammonia for a period of 30 minutes. After removal from the nitrogen, the wafers were flood exposed at 260 nm with 200 mJ/cm$^2$. The exposed wafers were baked for two minutes at 85° C. to allow the acid-catalyzed deblocking to occur. After baking, the wafers were developed for 5–10 seconds in 0.25M potassium hydroxide solution. The resulting relief pattern was the negative tone image of the mask used in the initial exposure.

EXAMPLE 4

Resist coated wafers were prepared and processed as in Example 3 except that, instead of ammonia, triethylamine vapor was used and the wafer was slightly warmed in the nitrogen stream to facilitate removing excess amine. The resulting pattern was the negative image of the mask used in the initial exposure.

What is claimed:

1. A method of image reversal for positive acting photoresists which utilize a latent photoacid to photogenerate acid which during subsequent baking deblocks a hydrophobic polymer to make it soluble in aqueous alkaline developing solutions which comprises the steps of:
   (1) imagewise exposure of a photoresist layer comprising said blocked polymer and said latent photoacid on a substrate to photogenerate an acid without deblocking said polymer;
   (2) in the absence of a post-exposure baking step, treatment of the exposed layer with a gaseous base to neutralize the acid generated in step (1) to a salt via an acid-base reaction;
   (3) removal of excess base;
   (4) flood exposure of the resist layer to photogenerate acid in areas not exposed in step (1);
   (5) baking the exposed photoresist layer of step (4) to deblock said polymer in the area not exposed in step (1); and
   (6) development in aqueous alkaline developer to remove the resist layer except for the portion exposed in step (1).

2. The method of claim 1 wherein the polymer is an imide-containing polymer where the imide functionalities have been blocked with an acid-labile group.

3. The method of claim 2 wherein the polymer is poly(N-tert-butyloxycarbonyl maleimide-co-styrene).

4. The method of claim 2 wherein the polymer is poly(N-tert-butyloxycarbonyl maleimide-co-4-tert-butyl styrene).

5. The method of claim 2 wherein the polymer is poly(N-tert-butyloxycarbonyl maleimide-co-decyl vinyl ether).

6. The method of claim 2 wherein the polymer is poly(dimethyl-N-tert-butyloxycarbonyl glutarimide).

7. The method of claim 2 wherein the polymer is poly(N-tert-butyloxycarbonyl maleimide).

8. The method of claim 2 wherein the blocking group is tert-butyloxycarbonyl.

9. The method of claim 2 wherein the blocking group is benzyloxycarbonyl.

10. The method of claim 1 wherein the polymer is a phenol containing polymer where the hydroxy functionalities have been blocked with an acid-labile group.

11. The method of claim 10 wherein the polymer is poly(tert-butyloxycarbonyloxy-α-alkyl styrene).

12. The method of claim 10 wherein the polymer is poly(tert-butyloxycarbonyloxy styrene).

13. The method of claim 10 wherein the blocking group is tert-butyloxycarbonyl.

14. The method of claim 10 wherein the blocking group is benzyloxycarbonyl.

15. The method of claim 1 wherein the polymer is a carboxylic acid containing polymer where the acid functionalities have been blocked with an acid-labile group.

16. The method of claim 15 wherein the polymer is poly(tert-butyl methacrylate).

17. The method of claim 15 wherein the polymer is poly(tert-butyl p-vinylbenzoate).

18. The method of claim 1 wherein the photogenerated acid is produced by the irradiation of an onium salt.

19. The method of claim 18 wherein the onium salt is an aryl diazonium salt.

20. The method of claim 18 wherein the onium salt is a diaryliodonium salt.

21. The method of claim 18 wherein the onium salt is a triarylsulfonium salt.

22. The method of claim 20 wherein the onium salt is a diphenyliodonium trifluoromethanesulfonate.

23. The method of claim 21 wherein the onium salt is triphenylsulfonium trifluoromethanesulfonate.

24. The method of claim 1 wherein the base is a primary, secondary or tertiary amine having 1 to 12 carbon atoms.

25. The method of claim 1 wherein the base is ammonia.

26. The method of claim 24 wherein the base is triethylamine.

* * * * *